United States Patent [19]

Brunsvold et al.

[11] Patent Number: 4,939,070
[45] Date of Patent: Jul. 3, 1990

[54] THERMALLY STABLE PHOTORESISTS WITH HIGH SENSITIVITY

[76] Inventors: William R. Brunsvold, 22 Clover Hill Rd., Poughkeepsie, N.Y. 12603; Ming-Fea Chow, Beyer Dr., Poughguag, N.Y. 12570; Willard E. Conley, 16 Chadeayne Ave., Cornwall, N.Y. 12518; Dale M. Crockatt, 29 Warren St., Somers, N.Y. 10589; Jean M. J. Fréchet, 810 Stanstead Road, Ottawa, Ontario K1V 6Y7, Canada; George J. Hefferon, High View Rd., Fishkill, N.Y. 12524; Hiroshi Ito, 722 Via Colina, San Jose, Calif. 95139; Nancy E. Iwamoto, 11700 SW. Butner Rd., Apt. 212, Portland, Oreg. 97225; Carlton G. Willson, 1982 University Ave., San Jose, Calif. 95126

[21] Appl. No.: 215,966

[22] Filed: Jul. 7, 1988

Related U.S. Application Data

[63] Continuation of Ser. No. 890,427, Jul. 28, 1986, abandoned.

[51] Int. Cl.$^5$ .............................................. G03C 5/16
[52] U.S. Cl. .................................... 430/312; 430/325; 430/326; 430/296; 430/328; 430/967; 430/942
[58] Field of Search ............... 430/325, 326, 312, 296, 430/328, 967, 942

[56] References Cited

U.S. PATENT DOCUMENTS 3,779,778 12/1973 Smith et al. ...................... 96/115 R
3,961,099 6/1976 Gipstein et al. ...................... 427/43
4,491,628 1/1985 Ito et al. ............................... 430/176

*Primary Examiner*—Roland E. Martin
*Assistant Examiner*—Cynthia Hamilton
*Attorney, Agent, or Firm*—John A. Stemwedel

[57] ABSTRACT

The present invention discloses particular lithographic polymeric materials and methods of using these materials, wherein the polymeric materials have acid labile or photolabile groups pendant to the polymer backbone. The polymeric materials are sufficiently transparent to deep UV radiation to permit deep UV imaging, can be used to produce resist structures having thermal stability at temperatures greater than about 160° C., and are sufficiently resistant to excessive crosslinking when heated to temperatures ranging from about 160° C. to about 250° C. that they remain soluble in common lithographic developers and strippers.

The present invention also discloses resists comprising substituted polyvinyl benzoates which, after imaging, exhibit unexpectedly high thermal stability, in terms of plastic flow. These resists cannot be imaged using deep UV because they exhibit such a high degree of opacity below 280 nm; however, they are useful as the top, imaging layer in a bilayer resist process wherein the top layer acts as a mask during deep UV exposure of the bottom layer.

15 Claims, 9 Drawing Sheets

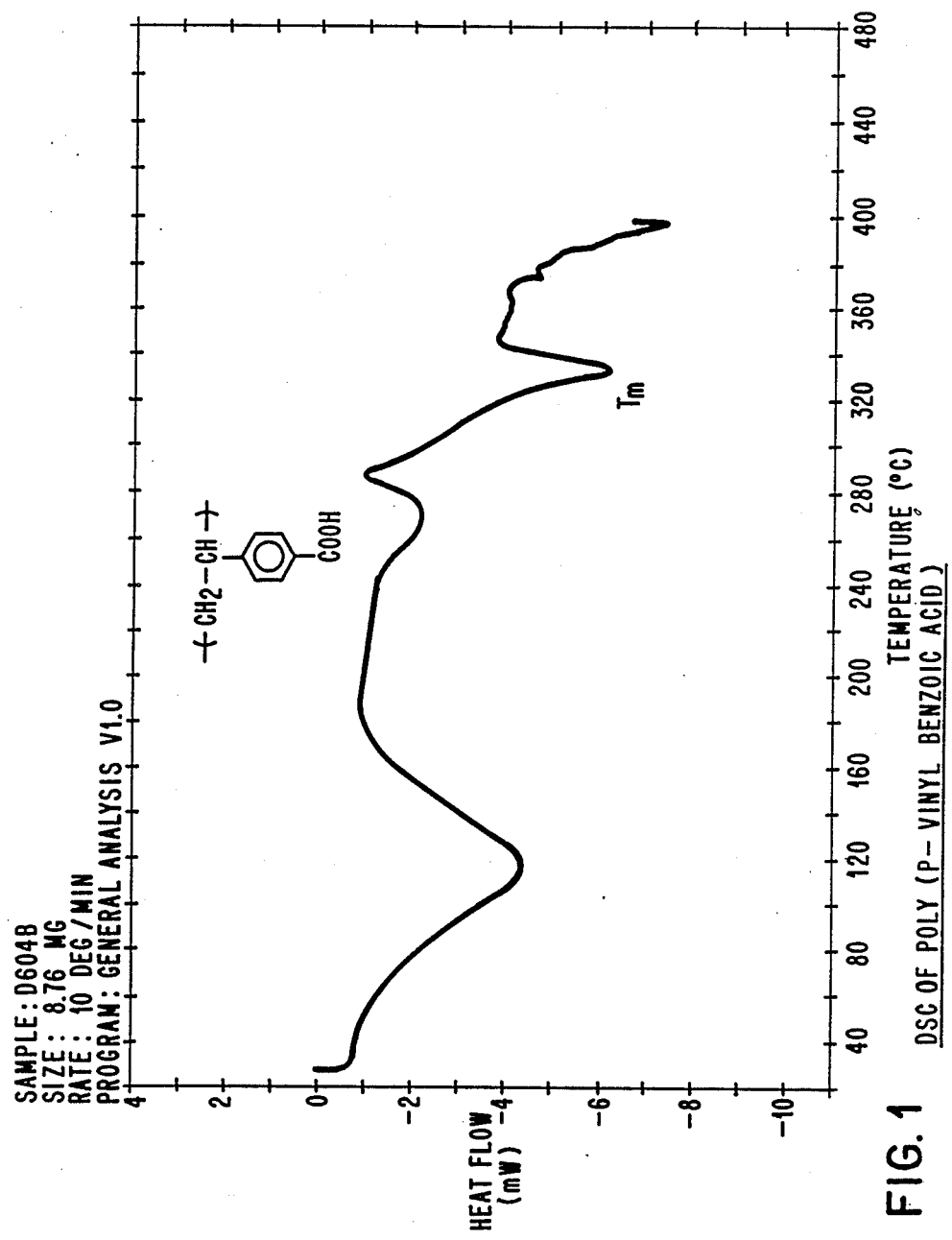

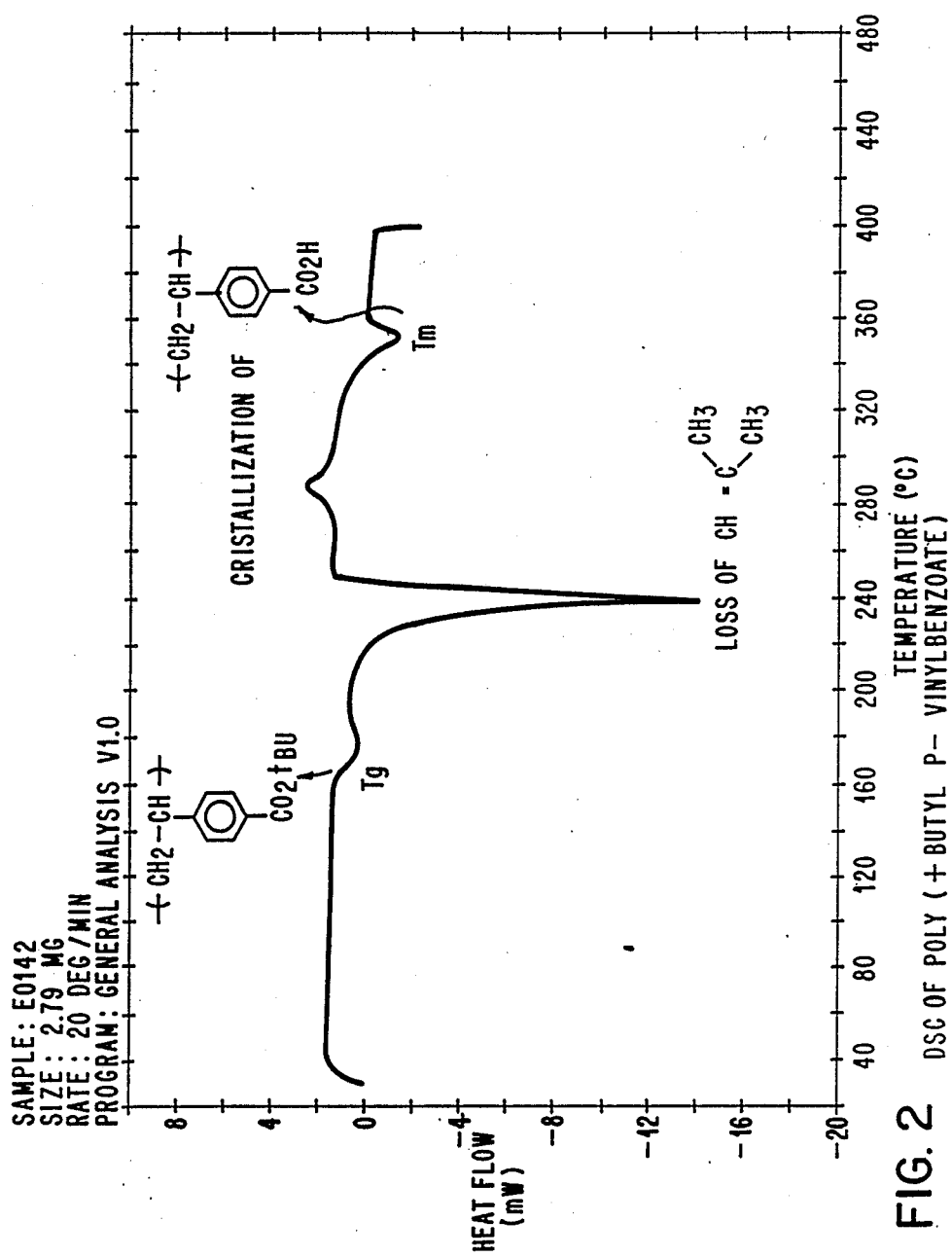

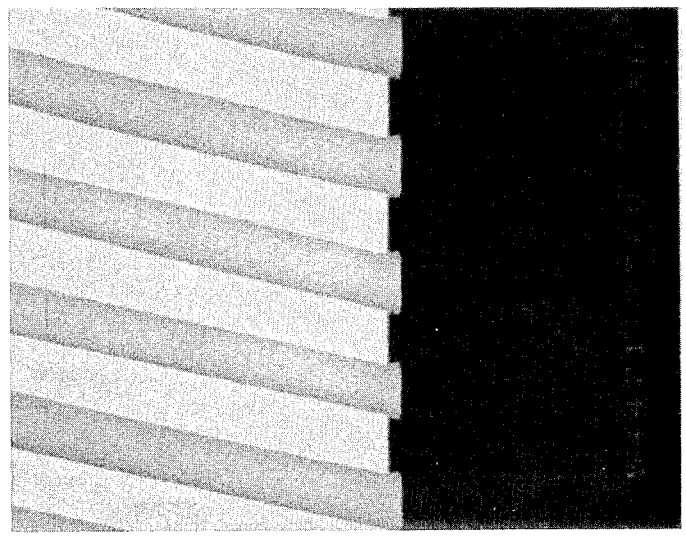
FIG. 7B  1 μ NEGATIVE TONE IMAGE
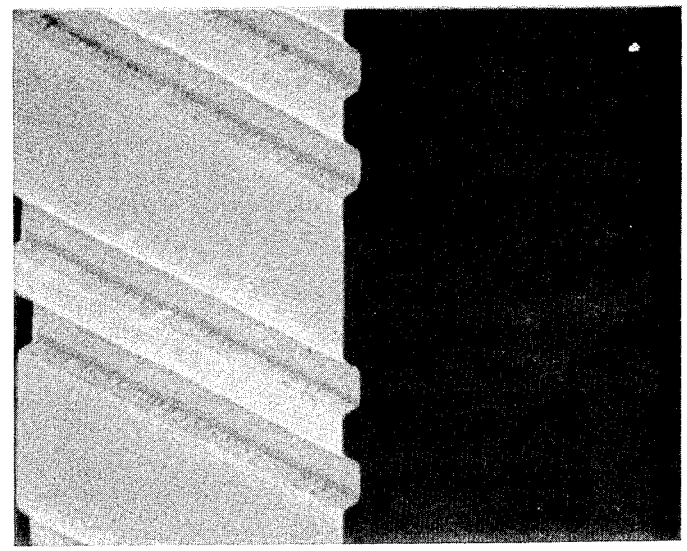
FIG. 7A  1.5 μ POSITIVE TONE IMAGE

THERMALLY STABLE PHOTORESISTS WITH HIGH SENSITIVITY

This is a continuation of application Ser. No. 890,427, filed July 28, 1986 now abandoned.

BACKGROUND OF THE INVENTION

1. Field of the Invention

The present invention relates to photoresists having high thermal stability in terms of plastic flow. The photoresists are comprised of structures having recurrent acid labile or photolabile groups, such that in the deprotected state (with the acid labile or photolabile group removed) they have a hydrogen bond donor and a free hydrogen bond acceptor. Thus, a hydrogen-bonded network is generated upon deprotection which requires energy to break. The recurrent acid labile or photolabile groups are typically pendant to the polymeric backbone.

2. Background Art

Processing of semiconductor devices frequently requires the use of temperatures as high as 200° C.; as a result, it is important to have resist materials which can withstand such temperatures without the occurrence of plastic flow which distorts the dimensions of the resist structure.

In U.S. Pat. No. 3,779,778, Smith et al. disclosed novel photosolubilizable compositions comprising (1) a water-insoluble compound containing one or more acid-degradable groups, and (2) a photoinitiator comprising a photolyzable acid progenitor.

In U.S. Pat. No. 4,491,628, resists sensitive to UV, electron beam and X-ray radiation with positive or negative tone upon proper choice of a developer are formulated from a polymer having recurrent pendant groups such as tert-butyl ester or tert-butyl carbonates that undergo efficient acidolysis with concomitant changes in polarity (solubility) together with a photoinitiator which generates acid upon radiolysis. A sensitizer component that alters wavelength sensitivity may also be added. The preferred acid labile pendant groups are tert-butyl esters of carboxylic acids and tert-butyl carbonates of phenols but, it is understood that a wide range of acid labile groups are operative in the invention. These include trityl, benzyl, benzhydryl modifications as well as others well known in the art.

Developed resist structures generated from the above, previously disclosed, preferred t-butyl carbonates of phenols such as poly(p-tert-butoxycarbonyloxymethylstyrene), poly(p-tert-butoxycarbonyloxystyrene), or poly(tert-butyl p-isoprophenylphenyloxyacetate) exhibit a thermal stability (in terms of plastic flow) of less than about 160° C. as measured by $T_g$ (determined by TGA at a heating rate of about 10° C./min).

The previously disclosed, preferred t-butyl ester of a carboxylic acid, poly(t-butyl p-vinylbenzoate) demonstrates a high opacity below about 280 nm, and thus is not useful for a single layer processes utilizing imaging via deep UV radiation; deep UV imaging being preferred for numerous reasons known in the art of lithography.

Developed resist structures generated from the previously disclosed, preferred t-butyl esters of carboxylic acids such as poly(tert-butyl methacrylate) form anhydride linkages which can crosslink upon heating so that the resist becomes insoluble in the common lithographic developers and strippers. Thus, it may not be possible to develop the latent image in the resist layer, or, if subsequent to developing, processing temperatures rise above about 160° C., the developed resist structure may not be removable from the underlaying substrate.

Thus, it would be desirable to have a resist material which is sufficiently transparent to deep UV (wavelengths below about 280 nm) prior to imaging, to permit deep UV imaging; which is thermally stable after imaging to processing temperatures greater than 160° C.; and, which does not crosslink upon heating to these same processing temperatures, to become insoluble in the common lithographic developers or strippers.

SUMMARY OF THE INVENTION

In accordance with the present invention, there are particular polymeric materials having acid labile or photolabile groups pendant to the polymer backbone which can be used to produce photoresist structures having thermal stability in terms of plastic flow at temperatures greater than about 160° C. Thermal stability of the polymeric material is provided for by selecting the polymeric material from polymeric structures which, in the deprotected state (after removal of the acid labile or photo labile group), have a hydrogen bond donor and a free hydrogen bond acceptor, such that a hydrogen bonded network is generated upon deprotection of the polymeric structure, and wherein the hydrogen bonded network requires energy to break. Examples of these types of structures include, but are not limited to, substituted polyvinylbenzoates, substituted maleimide-comprising polymers and similar polymeric congeners such as polymers comprising substituted 1,2,4-triazoline-3,5-dione, substituted styrene-maleimide copolymers and terpolymers, substituted styrene-acrylate copolymers and terpolymers, and other copolymers or terpolymers comprising styrene and containing functionalities capable of hydrogen bonding, wherein oxygen, sulfur or nitrogen moieties within the polymeric structure are substituted with an acid labile functional group or a photolabile functional group.

In accordance with the present invention, there are particular polymeric materials having acid labile or photolabile groups pendant to the polymer backbone which are sufficiently transparent to deep UV radiation to permit deep UV imaging, which can be used to produce resist structures having thermal stability at temperatures greater than about 160° C., and which do not crosslink significantly when heated to temperatures ranging from about 160° C. to about 250° C.

The resist compositions comprising acid labile groups pendant to the polymer backbone are sensitive to deep UV, electron beam, or X-ray radiation. The resist compositions comprising photo labile groups pendant to the polymer backbone are sensitive to deep UV and may be sensitive to electron beam or X-ray radiation. All of the resist compositions can be processed to form positive tone or negative tone images. The resist compositions are comprised of at least one polymer, copolymer, or terpolymer having recurrent acid labile groups pendant to the polymer backbone in combination with a photoactive compound capable of generating an acid upon exposure to radiation, or at least one polymer, copolymer or terpolymer having recurrent photolabile groups pendant to the polymer backbone.

The thermal stability (in terms of plastic flow) of the polymer comprising the resist is provided for by selecting the polymer from polymeric structures which, in the deprotected state (after removal of the acid labile or photo labile group) have a hydrogen bond donor and a free hydrogen bond acceptor, such that a hydrogen bonded network is generated upon deprotection of the polymeric structure, wherein the hydrogen bonded network requires energy to break. Examples of these types of structures include, but are not limited to, substituted maleimide-comprising polymers and similar polymeric congeners such as polymers comprising substituted 1,2,4-triazoline-3,5-dione, substituted sytrene-maleimide copolymers and terpolymers, substituted styrene-acrylate copolymers and terpolymers, and other copolymers or terpolymers comprising styrene and containing functionalities capable of hydrogen bonding, wherein oxygen, sulfur or nitrogen moieties within the polymeric structure are substituted with an acid labile functional group or a photolabile functional group.

The acid labile functional group may comprise, for example, a carboxylic acid ester, a carbonic acid ester, a carbamate, a triamide, or other isosteric functionalities. Esters, carbamates, and triamides which undergo acid catalyzed $S_1$-1 cleavage or hydrolysis may be useful. Esters, carbamates, and triamides which undergo $A_{AL}$-1 type cleavage and which have an available proton adjacent to the carbonium ion forming during clevage or which undergo rearrangement such that a carbonium ion is generated with an adjacent α proton, are preferred.

The photo labile functional group comprises, for example, esters of N-hydroxy amides or esters of N-hydroxy imides, wherein irradiation of a photolyzable bond results in a cleavage reaction. Esters of N-hydroxy imides which undergo a Norrish type cleavage and which undergo minimal recombination of photolyzed groups are useful. Esters of N-hydroxy imides wherein differential solubility in lithographic developers is unaffected by recombination of photolyzed fragments are preferred.

In addition to selecting the resist polymer to meet the above thermal plastic flow criteria, it is necessary to keep in mind the requirements of substantial deep UV transparency. The types of polymers described above typically should have sufficient transparency to deep UV radiation to permit imaging. However, one skilled in the art can determine with minimal experimentation whether sufficient transparency exists. The types of polymers described above typically should not significantly crosslink at temperatures below 250° C. Thus, pendant groups selected for use in the present invention should be those which after deprotection do not easily crosslink with other polymeric structures.

In a discovery related to the above-described invention, applicants discovered that resists comprising substituted polyvinyl benzoates, which are converted to poly(vinylbenzoic acid) upon exposure to radiation, exhibit unexpectedly high thermal stability in the range of about 250° C. to about 280° C. These resists cannot be imaged using deep UV because both the polyvinyl benzoates and the poly(vinylbenzoic acid) exhibit such a high degree of opacity below 280 nm. However, resists comprising substituted polyvinyl benzoates combined with a photoactive compound capable of generating an acid upon exposure to radiation can be imaged using mid UV (about 300 nm to about 400 nm), electron beam, or X-ray radiation. The addition of dyes and other additives to the resist formulation permits imaging using near UV (about 400 nm–450 nm). Thus, although the resists comprising substituted polyvinyl benzoates cannot be used for single layer resist processes utilizing deep UV imaging, they can be used for single layer resist processes using the above imaging radiation sources. In addition, these resists can be used as the top, imaging layer in a bilayer structure wherein the top layer acts as a mask during deep UV exposure of the bottom layer (a portable conformable mask process).

BRIEF DESCRIPTION OF THE DRAWINGS

FIG. 1 shows the DSC trace for poly(p-vinylbenzoic acid), which was produced in the irradiated areas of the poly(t-butyl p-vinylbenzoate; sensitized resist, wherein melting of the resist does not occur below 250° C.

FIG. 2 shows the DSC trace of poly(t-butyl p-vinylbenzoate) including the temperature at which crystallization of the poly(p-vinylbenzoic acid) occurs and the temperature at which melting of the poly(p-vinylbenzoic acid) occurs.

FIG. 7A shows a SEM of a positive tone single layer resist structure created using a poly(styrene-co-N-(4-t-butyloxycarbonyloxy-phenyl)-maleimide polymer comprised photoresist, wherein the photoresist was imaged and developed directly over a silicon wafer substrate.

FIG. 7B shows a SEM of a negative tone single layer resist structure created using the polymer of FIG. 7A, wherein the resist was imaged and developed directly over a silicon water substrate.

DESCRIPTION OF THE PREFERRED EMBODIMENTS

The syntheses of several of the polymers which can be used in the present invention are well documented in the literature. In cases wherein the synthesis of a particular polymer is not documented, or wherein the particular polymer is not commercially available, the method of synthesis is included in the description of the particular preferred embodiment.

The first two of the preferred embodiments described below are for the resists comprising substituted polyvinylbenzoates, wherein the imaged resists have exhibited the unexpected thermal stability as previously described:

EXAMPLE 1

Polyvinylbenzoate sensitized with a photoactive compound such as an onium salt has been imaged and developed to form a patterned resist. In the case of a negative tone resist (the portion of the resist remaining after development is the portion of the resist exposed to patterned radiation prior to development), the developed resist is thermally stable up to about 250° C. In the case of a positive tone resist (the portion of the resist remaining after development is the portion of the resist which was not exposed to the patterned radiation), the developed resist is blanket exposed to radiation in order to obtain the approximately 250° C. thermal stability.

Specifically, poly(t-butyl p-vinylbenzoate) was dissolved in cyclohexanone at a concentration of about 13.2% by weight, to which was added 4-thiophenoxyphenyl (diphenyl)sulfonium hexafluoroantimonate sensitizer at a concentration of about 10.0% by weight of the vinylbenzoate polymer. The resist film was spin-cast onto one inch diameter silicon wafers at about 3000 rpm and prebaked at about 130° C. for about 5 minutes, resulting in a cast film thickness of about 0.65 micrometers. The resist film was exposed through a mask to about 20 mJ/cm$^2$ of 313 nm radiation, was postbaked at about 130° C. for about 2 minutes, and was developed with anisole solvent and spray development techniques known in the art. The resulting high resolution image was heated at 230° C. for about 30 minutes on a hot plate in air. No deformation due to thermal flow or outgassing was observed.

The $T_g$ of unexposed poly(t-butyl p-vinylbenzoate) is about 160° C. The high thermal stability of the developed photoresist results from the fact that exposure of the sensitized resist, followed by heat treatment (to react the photoaltered sensitizer with the vinylbenzoate polymer) generates poly(p-vinylbenzoic acid). The poly(p-vinylbenzoic acid) produced does not melt below 250° C., as indicated by DSC and shown in FIG. 1. The acid polymer appears to crystallize at about 280° C. and the onset of melting is observed at about 300°–320° C. FIG. 2 shows a comparison of the heat flow characteristics of the poly(t-butyl p-vinylbenzoate) as compared to the heat flow characterisitics of the poly(p-vinylbenzoic acid).

Figure 3A:
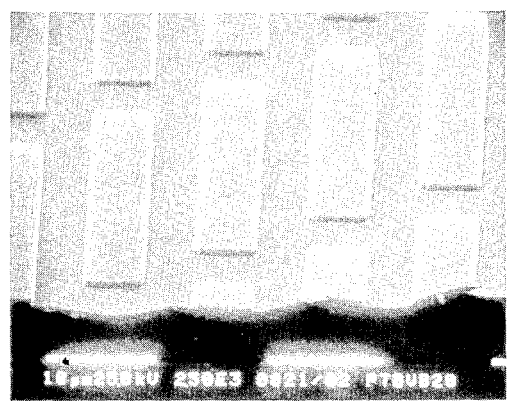
FIGS. 3A and 3B show SEMs of the negative images created using the poly(t-butyl p-vinylbenzoate) comprised resist after heating of the resists at about 230° C. for a period of about 30 minutes.
Figure 3B:
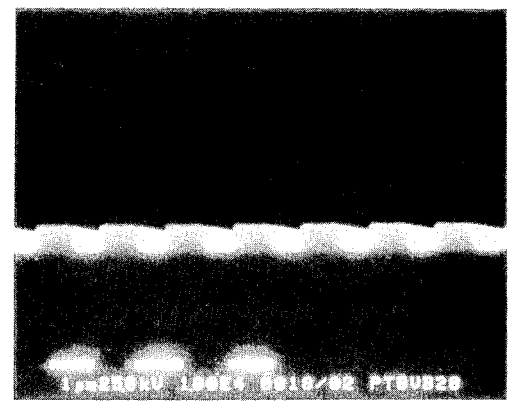

A developed positive tone resist does not have the thermal stability because the alteration from poly(t-butyl p-vinylbenzoate) to poly(p-vinylbenzoic acid) has not occurred in the non-irradiated (unexposed) areas of the resist. Thus, it is necessary to blanket expose the developed positive tone resist to the radiation at about 313 nm, followed by heat treatment as described above in order to obtain the thermally stability in the positive tone resist. This blanket exposure requires only about 20 mJ/cm$^2$ or even less, and differs from the so-called UV hardening. FIGS. 3A and 3B show SEMs of the negative images after heating at 230° C. for a period of about 30 minutes.

EXAMPLE 2

Polyvinylbenzoate sensitized with a photoactive compound such as an onium salt has also been used as a portable conformable mask (PCM) for deep UV pattern transfer to an underlying planarizing layer. The polyvinylbenzoate, sensitized with an onium salt, has been imaged in either positive or negative tone by exposure to mid UV, electron beam, or X-ray radiation. The imaged resist film serves as a very effective PCM mask for deep UV exposure of underlaying layers (such as PMMA, methacrylate terpolymers such as methyl methacrylate/methacrylic acid/methacrylic anhydride, polyglutarimides such as polydimethylglutarimide, substituted maleimide-comprised photoresist, substituted styrene-maleimide-comprised copolymer photoresist, etc.) due the extremely high absorbance of the polyvinylbenzoate and the poly(vinylbenzoic acid) in the deep UV region, allowing a high resolution pattern transfer.

In particular, we found that poly(t-butyl p-vinylbenzoate) sensitized with 4-thiophenoxyphenyl (diphenyl)-sulfonium metal halide can be imaged in either positive or negative tone by exposure to 313 nm UV radiation; followed by heat treatment at about 100° C.; and development by the developer capable of yielding the tone of image desired. The poly(t-butyl p-vinylbenzoate polymer is so opaque below about 280 nm that the imaged resist serves as an excellent mask for the underlaying planarizing layer in the PCM process. When 313 nm radiation is used for imaging, exposure to less than 20 mJ/cm$^2$ is adequate to provide, high resolution positive or negative patterns in the sensitized poly(t-butyl p-vinylbenzoate) photoresist described above. The poly(t-butyl p-vinylbenzoate) polymer has also been sensitized to the 400 nm spectral region with use of a dye such as perylene, or a phenothizaine.

Because the polyvinyl benzoate resins themselves (before and after exposure to radiation) are very opaque to radiation below 280 nm, the thickness of the imaging resist film can be reduced to 0.4 micrometers without increasing the sensitizer loading; this provides more flexibility in optimization of the sensitizer loading. For example, a 0.65 micrometer thick film of poly(t-butyl p-vinylbenzoate) containing about 10% by weight of 4-thiophenoxyphenyl(diphenyl) sulfonium hexafluoroantimonate has demonstrated an optical density of about 3.0 at 254 nm, and a 1.0 micrometer thick film of the poly(p-vinylbenzoic acid) polymer formed after irradiation and heat treatment has demonstrated an optical density of 3.5 at 254 nm.

The poly(t-butyl p-vinylbenzoate) was prepared by radical initiated polymerization of t-butyl p-vinylbenzoate which was synthesized by converting 4-carboxybenzaldehyde to t-butyl ester, and the C═C double bond was introduced by the Wittig reaction. An alternative route to the desired polymer is the radical polymerization of commercially available p-vinylbenzoic acid followed by a reaction in which t-butyl replaces the H on the benzoic acid moiety, to create the ester.

In a demonstration of the PCM process, commercially available poly(methylmethacrylate) was dissolved in chlorobenzene at a concentration of about 11% by weight and spin-cast on one inch diameter silicon wafers. The cast film was heat treated at about 160° C. for about one hour to provide films about 2 micrometers thick.

Poly(t-butyl p-vinylbenzoate) was dissolved in cyclohexanone at a concentration of about 13 weight %, to which was added 4-thiophenoxyphenyl(diphenyl) sulfonium hexafluoroantimonate at a loading of about 10.0% by weight based on the polymer. The poly(t-butyl p-vinylbenzoate solution was spin-cast upon the surface of the poly(methylmethacrylate) film and the structure was then heat treated to provide a poly(t-butyl p-vinylbenzoate) film thickness of about 0.65 micrometer. The poly(t-butyl p-vinylbenzoate) resist was then exposed through a mask to about 30 mJ/cm$^2$ dosage of 313 nm radiation, heat treated at about 130° C. for a period of about 2 minutes, and developed in tetramethylammoniumhydroxide aqueous base developer for a period of about 15 seconds, to provide a positive tone resist pattern in the poly(t-butyl p-vinylbenzoate) resist layer.

The processed resist structure was then blanket-exposed to about 1.6 J/cm$^2$ (measured at 220 nm) of unfiltered UV light. The latent image thus created in the poly(methylmethacrylate) resist layer was developed using an acetone/isopropanol (2/1) developer and a development time of about 195 seconds. This procedure generated an uncapped resist structure in which the poly(t-butyl p-vinylbenzoate) patterned resist layer was removed during development.

Alternatively, the processed resist structure was blanket exposed to about 30 mJ/cm$^2$ of 313 nm radiation, followed by heat treatment at about 130° C. for a period of about 2 minutes, to convert the ester to the acid polymer (thus rendering the polymer insoluble in butyl acetate). This procedure was followed by blanket exposure of the resist structure to about 1.6 J/cm$^2$ (measured at 220 nm) of unfiltered UV light. The latent image in the poly(methylmethacrylate) resist layer was subsequently developed in butyl acetate using about a 5 minute development time period. This procedure resulted in the formation of a capped resist structure in which both patterned polymeric layers remained after development. Note that the order of blanket exposure to radiation (313 nm and 220 nm) does not appear to be critical in this alternative method of use of the polyvinylbenzoate photoresist.

In another alternative, the exposed and heat treated poly(t-butyl p-vinylbenzoate) was developed into a negative tone pattern using anisole and spray development techniques as known in the art. This processed resist structure was then blanket exposed to about 1.6 J/cm$^2$ (measured at 220 nm) of unfiltered UV light. The latent image thus created in the layer of poly(methylmethacrylate) was then developed in 3-heptanone for a period of about 10 minures to provide a negative tone capped structure. The upper or capping layer of poly(p-vinylbenzoic acid) (formed upon exposure of the poly(t-butyl p-vinylbenzoate) to the 313 nm radiation followed by heat treatment) can be removed, if desired, via a brief dipping of the resist structure in aqueous base developer such as the tetramethyl ammonium hydroxide.

The remaining preferred embodiments are typical of the present invention wherein the resist material is sufficiently transparent to deep UV prior to imaging to permit deep UV imaging, is thermally stable at temperatures greater than about 160° C., and does not crosslink on exposure to the imaging radiation or upon heating to temperatures ranging between about 160° C. and about 250° C.

EXAMPLE 3

Figure 4A:
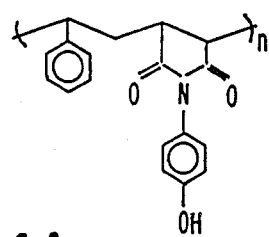
FIG. 4A shows the structure of poly(styrene-co-N-(4-hydroxyphenyl)-maleimide.
Figure 5:
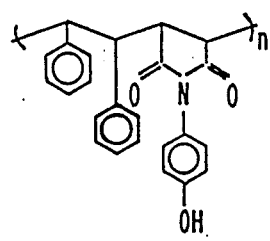
FIG. 5 shows the structure of poly(stilbene-co-N-(4-hydroxyphenyl)-maleimide).
Figure 6:
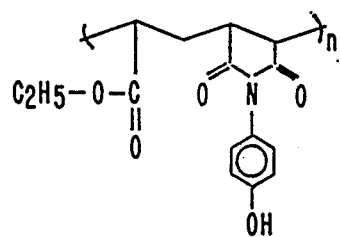
FIG. 6 shows the structure of poly(ethylacrylate-co-N-(4-hydroxyphenyl-maleimide).

Three different maleimide-comprised polymers obtained from Eastman Kodak company were converted to polymers comprising acid labile functional groups of the type which meet the thermal stability requirements of and can be used in applications of the present invention. The three maleimide-comprised polymers included: poly(styrene-co-N-(4-hydroxyphenyl)-maleimide (FIG. 4A), poly(stilbene-co-N-(4-hydroxyphenyl)-maleimide) (FIG. 5), and poly(ethylacrylate-co-N-(4-hydroxyphenyl-maleimide) (FIG. 6).

Figure 4B:
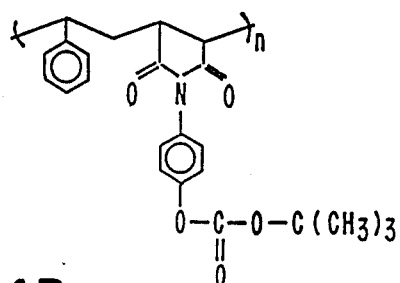
FIG. 4B shows the structure of poly(styrene-co-N-(4-t-butyloxycarbonyloxyphenyl)-maleimide.

In a typical example of the conversion of one of the above polymers to a polymer comprising acid labile functional group, the poly(styrene-co-N-(4-hydroxyphenyl)-maleimide was converted to poly(styrene-co-N-(4-t-butyloxycarbonyloxyphenyl)-maleimide (FIG. 4B) by a reaction between the poly(styrene-co-N-(4-hydroxyphenyl)-maleimide, 4-dimethylaminopyridine, di-t-butyl pyrocarbonate, and triethylamine in tetrahydrofuran solution. Specifically, a typical synthesis is as follows: the di-t-butyl pyrocarbonate was added to a solution of the above-described reactants and stirred for about 18 hours at about 20° C. After removal of the solvent, the residue was dissolved in methylene chloride, treated with sodium bicarbonate solution, and the polymer was precipitated by addition to ethyl ether. Spectral analysis of reaction products indicates a typical conversion of hydroxyl moieties to carbonate in excess of 99%. The negatively imaged resist exhibits a T$_g$ of about 220° C. Resist structures imaged in the positive mode can be processed to increase thermal stability to about 220° C. by a short exposure to deep UV radiation followed by subsequent heat treatment at about 130° C.

The poly(styrene-co-N-(4-t-butyloxycarbonyloxyphenyl)-maleimide can be used in a lithographic application as follows: a photoresist comprising the maleimide-comprised polymer and a triphenylsulfonium hexafluoroantimonate sensitizer, with a sensitizer concentration of about 4% to about 10% by weight was prepared. A typical solution comprised about 15% to 25% by weight polymer and sensitizer combined in gamma butyrolactone solvent.

The photoresist was spin applied to a silicon wafer surface, and then dried in a convection oven to provide a film thickness between 0.7 and 2.2 micrometers. The wafer was then patternwise exposed to UV radiation using wavelengths between about 200 and about 300 nm at a typical dose of about 3 mJ/cm$^2$, followed by heating to about 130° C. for a period of about two minutes. The exposed areas of the maleimide-comprised photoresist were developed using a solution of about 0.1 normal to about 0.2 normal potassium hydroxide in water and isopropyl alcohol to provide a single layer 1.5 micrometer positive tone resist structure. A SEM showing this positive tone resist structure is shown in FIG. 7A. A one micrometer negative tone resist structure was formed by treating the latent imaged resist structure with an anisole developer. a SEM showing this negative tone resist structure is shown in FIG. 7B.

Multilayered resist structures have also been produced from the above-described maleimide-comprised resist using a PCM technique. After application of the maleimide-comprised resist to a substrate, a conventional imaging resist, in this case a novolak resin with a diazoquinone photosensitizer in ethyl cellosolve acetate/butyl acetate, was spin applied and soft baked to dryness over the underlayer film comprising the maleimide-comprised photoresist described above. The novolak photoresist was then imaged and developed, using known in the art techniques. Either near UV or mid UV irradiation can be used to image the novolak photoresist. The wafer was then flood exposed to deep UV radiation as described above, thermally treated to about 130° C., and developed as described above for positive tone resist structures. Resist structures having dimensions of about 1.5 micrometers were obtained.

EXAMPLE 4

Other polymeric resist materials which meet the requirements of the present invention, including thermal stability regarding plastic flow, sufficient deep UV transparency to permit deep UV imaging, and resistance to excessive crosslinking (which results in insolubility in common developers or strippers), include poly(styrene-co-O-t-butyloxycarbonyl-N-hydroxymaleimide) and derivatives thereof.

EXAMPLE 4A

Figure 8:
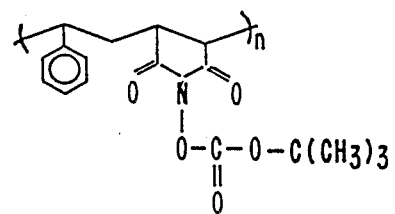
FIG. 8 shows the structure of poly(styrene-co-O-t-butyloxycarbonyl-N-hydroxy)-maleimide.

The synthesis of poly(styrene-co-O-t-butyloxycarbonyl-N-hydroxy-maleimide, shown in FIG. 8, was carried out via the free radical copolymerization of styrene and N-(t-butyloxycarbonyloxy)-maleimide in dimethylacetamide or dioxane solution at about 40° C. over about 5 to about 24 hours using about 3% by weight azoisobutylnitrile (AIBN) as a polymerization initiator. The t-butyloxycarbonyl-N-hydroxymaleimide monomer was obtained from the insitu thermal cracking of the furan Diels Alder adduct during the polymerization. The Diels Alder adduct was prepared by known-in-the-art procedures using furan, maleimide, and di-t-butyl pyrocarbonate.

EXAMPLE 4B

Figure 9:
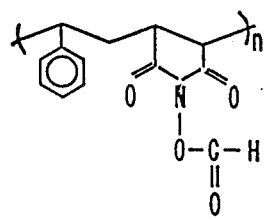
FIG. 9 shows the structure of poly(styrene-co-N-(formyloxy)-maleimide).

A closely related polymeric structure not having the t-butyl side chain, poly(styrene-co-N-(formyloxy)-maleimide), shown in FIG. 9, was prepared by the free radical copolymerization of styrene and N-formyloxymaleimide, other conditions similar to those described for EXAMPLE 4A. The N-formyloxymaleimide was obtained from the insitu thermal cracking of a N-formyloxymaleimide/furan Diels Alder adduct, as described above.

Polymers of the type described in EXAMPLES 4A AND 4B comprise deep UV photolabile groups and can be imaged without the addition of a sensitizer. A sensitizer can be added to decrease the radiation dosage required for imaging or to extend the sensitivity of the resist into the mid UV range.

EXAMPLE 5

Other polymeric photoresists which meet the requirements of the present invention include poly(4-t-butyloxycarbonyloxystyrene-co-N-methylmaleimide) and various derivatives thereof.

EXAMPLE 5A

Figure 10:
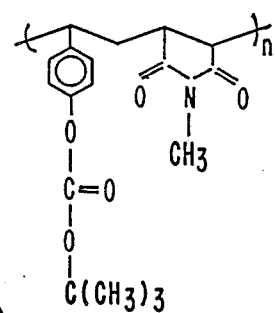
FIG. 10 shows the structure of poly(4-t-butyloxycarbonyloxystyrene-co-N-methyl-maleimide).

Poly(4-t-butyloxycarbonyloxystyrene-co-N-methylalmaleimide) was synthesized using free radical copolymerization of N-methylmaleimide and 4-t-butyloxycarbonyloxystyrene with azeisobutylnitrile in toluene at 70° C. over about 16 hours. The A 1:1 alternating copolymer was isolated. The structure obtained is shown in FIG. 10. The phenolic polymer which results on deprotection or removal of the acid labile t-butyl carbonate moiety exhibits a $T_g$ of about 250° C. as measured by DSC.

EXAMPLE 5B

Figure 11:
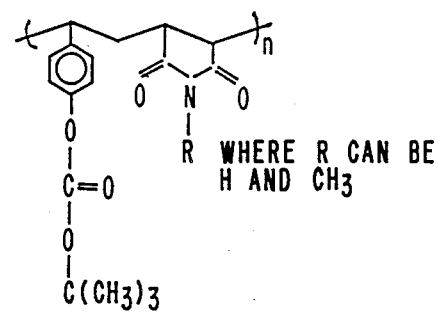
FIG. 11 shows the structure of poly(4-t-butyloxycarbonyloxystyrene-co-N-methylmaleimide-co-maleimide).

A terpolymer related to the copolymer of EXAMPLE 5A, containing up to 15% by weight non-alkylated maleimide, has also been prepared in a manner similar to EXAMPLE 5A. The product of the reaction was a polymer with a backbone of 1:1 alternating maleimide/styrene residues. The methyl and hydrogen substituents are randomly distributed on the maleimide nitrogens. This is poly(4-t-butyloxycarbonyloxy-styrene-co-N-methylmaleimide-co-maleimide) which is illustrated in FIG. 11. Thermal performance is essentially similar to that of the copolymer of EXAMPLE 5A.

The resist polymers described above can be used for single layer microlithography in either the positive or negative imaging mode, and are also useful for deep UV sensitive positive tone PCM underlayer applications. A typical resist comprises the polymer and an onium salt photosensitizer, wherein the concentration of the sensitizer ranges from about 2.5% to about 8% by weight based on the polymer. The resist is typically applied to a substrate using standard spin coating techniques, wherein the resist is placed into solution at concentrations of up to about 25% in a solvent such as 1-methyl-2-pyrrolidone, n-methylmorpholine, or gammabutyrolactone, or solvent mixtures containing any of these solvents. Resist solutions of this type have been spin coat applied onto silicon wafers to provide high quality films with low defect levels and film thicknesses ranging from about 0.7 to 2.5 micrometer in thickness. Such films provide high contrast during imaging; for example, the polymers described in EXAMPLES 5A AND 5B exhibit a contrast value ratio (gamma) greater than 3.8.

The polymers of this example have been used in a PCM process for producing bilayer resist structures as follows: A substrate such as a silicon wafer surface was first treated with an adhesion promoter such as hexamethyldisilazane. The polymer of the type described in EXAMPLES 5A-5B, in combination with a photosensitizer of the type previously described, was spin applied to the wafer and heat treated to dry the film. Subsequently, a diazoquinone sensitized novolak photoresist in an appropriate solvent such as dipropylene glycol monomethyl ether was applied over the surface of the resist polymer of the type described in this example. The novolak photoresist was imagewise exposed to near or mid UV radiation, and developed in aqueous base using standard techniques, to create a patterned layer overlaying the resist layer comprising one of the polymers of the type described in this example of the present invention. The resist structure was then exposed to radiation of wavelength ranging from about 200 nm to about 300 nm so that exposed portions of the underlaying resist layer comprising the polymer of the present invention was exposed to radiation in areas wherein the novolak resist is not present. The resist structure was heat treated to obtain chemical reaction in the exposed portions of the underlaying resist layer, and the underlaying layer was then developed in an aqueous alkaline solution containing an alcohol such as isopropyl alcohol. Bilayer resist structures with lithographic features about one micron in size were produced using this method.

EXAMPLE 6

Figure 12:
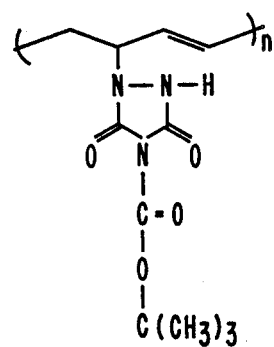
FIG. 12 shows the structure of poly(3-butadi-1-ene-(1-(4-(t-butyloxycarbonyl)-1,2,4-triazoline-3,5-dione))).

Poly(3-butadi-1-ene-(1-(4-(t-butyloxycarbonyl)-1,2,4-triazoline-3,5-dione))) of the structure shown in FIG. 12 was prepared by the reaction of polybutadiene with 4-(t-butyloxycarbonyl)-1,2,4-triazoline-3,5-dione. The condensation procedure followed the method of Butler and Williams for the reaction of simple alkyl substituted triazolinediones with various polymers. See G. B. Butler, A. G. Williams, J. Polymer Sci., Poly. Chem. Ed., 17, 1117, 1979. The triazolinedione was isolated from the $NO_2$ oxidation of the corresponding triazolidinedione, which was, in turn, isolated from the base catalyzed condensation of N-(t-butyloxycarbonyl)-N'-(O-(trifluoromethanesulfonylcarbamido)-urea. The $T_g$ of the decarboxyalkylated (deprotected) polymer after imaging as previously described for the sensitized photoresist comprising the polymer was 233° C.

EXAMPLE 7

Figure 13:
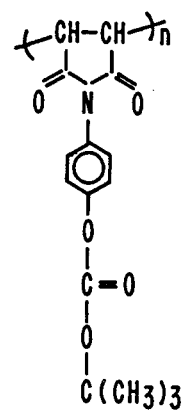
FIG. 13 shows the structure of poly(N-(4-t-butyloxycarbonyloxyphenyl) maleimide).

Other polymeric materials suitable for use as resists which meet the requirements of the present invention include poly(N-(4-tert-butyloxycarbonyloxyphenyl)-maleimide) as shown in FIG. 13.

The poly(N-(4-tert-butyloxycarbonyloxyphenyl) maleimide is synthesized according to the following scheme. Di-t-butylpyrocarbonate is reacted with p-aminophenol to give p-(t-butyloxycarbonyloxy) aniline, I. Reaction of I with maleic anhydride then affords N-(p-t-butyloxycarbonyloxyphenyl)maleamic acid, II. Monomer II is modified by treatment with sodium acetate and acetic anhydride to yield monomer III, N-(p-t-butyloxycarbonyloxyphenyl)maleimide. Monomer III is polymerized in the presence of azoisobutylnitrile (AIBN) to yield poly-N-(4-tert-butyloxycarbonyloxyphenyl) maleimide.

Preparation of p-(t-butyloxycarbonyloxyaniline), I

To a suspension of 16.4 gm (0.15 mole) of p-aminophenol in 350 ml of THF in an ice-water bath were added 16.8 gm (0.15 mole) of potassium t-butoxide, then the dull suspension was stirred for 15 min. at the low temperature under nitrogen atmosphere. Di-t-butyl-pyrocarbonate, 34.9 gm (0.16 mole) was added slowly to the suspension, then the brown jelly-like mixture was further reacted at room temperature for 3 hours. The mixture was precipitated into large amounts of water, filtered and dried to yield 26.8 gm of p-(t-butyloxycar-bonyloxyaniline), I, in 86% yield.

Preparation of
N-(p-t-butyloxycarbonyloxyphenyl)-maleamic acid, II

N-(p-t-butyloxycarbonyloxyphenyl)maleamic acid, II

To a solution of 25.2 gm (0.12 mole) of I in 350 ml of toluene was added 11.8 gm (0.12 mole) of maleic anhydride, then the instantaneously formed slurry was refluxed for 15 hours. The mixture was filtered and washed with toluene. A crude tinged powdery product, II, was obtained in a yield of 29.1 gm (79%).

Preparation of
N-(p-t-butyloxycarbonyloxyphenyl)-maleimide, III

In a one-liter flask was charged 18.5 gm (0.06 mole) of II, 5.0 gm (0.06 mole) of sodium acetate, 40 ml of acetic anhydride, 0.05 gm of t-butylcatechol inhibitor, and 220 ml of dichloromethane. The mixture became a clear solution with heating and the solution was refluxed for 3 hours. After the reaction, sodium acetate was filtered off and volatiles were stripped from the dark brown filtrate. The residual liquid was treated with ethanol and tinged powdery crude III was obtained in a yield of 13.3 gm (77%), mp. 128°-130° C. Recrystallization was performed in 100 ml of acetone/methanol/ethanol (1:1:10 v/v) to provide colorless needles, 8.3 gm (48% yield) of III, mp. 142°-143° C.

Radical polymerization of III

In a stopcocked flask, 5.8 gm (0.02 mole) of the monomer III was placed with 64 mg of a radical initiator AIBN (2 mole %) and the mixture was dissolved with 12 ml of dioxane. The polymerization was carried out at 60° C. for 9 hours under nitrogen atmosphere. After precipitation into methanol, filtration, and drying overnight yielded 4.5 gm (78% conversion) of poly-N-(4-tert-butyloxycarbonyloxyphenyl)maleimide.

The resist polymer described above can be used for single layer microlithography in either the positive or negative imaging mode and may also be useful for deep UV sensitive positive tone PCM underlayer applications. A typical resist solution comprises the polymer and an onium salt photosensitizer in cyclohexanone solution wherein the concentration of the sensitizer is about 14% by weight based on polymer.

In a typical lithographic process, resist solutions of this type have been spin coated onto silicon wafers and then dried on a hot plate at about 130° C. for about 5 minutes to provide about 0.7 um films.

A latent image was created within the resist film by patternwise exposure to about 3 to 5 mJ/cm$^2$ of 254 nm radiation passed through a narrow band width filter, followed by heat treatment at about 140° C. for a period of about 2 minutes. Positive tone imaged resist was produced by developing the latent image within the resist film in an alcoholic aqueous base developer consisting of about 0.1 molar tetramethylamoniumhydroxide dissolved in about 2:1 (v/v) H$_2$O/methanol. Negative tone imaged resist was produced by developing the latent image within the resist film in a solution of methyl ethyl ketone/anisole (2:1 v/v) developer. Imaged resists with resolution of about 1 micrometer can be obtained using the above processes.

Thermally induced plastic flow was not observed in the above imaged resist structures after heat treatment at about 250° C. for about one hour.

While only the preferred embodiments of the present invention are described above, many potential modifications which fall within the generic concept of the invention will occur to those skilled in the art upon a reading of the present disclosure. Such modifications in terms of polymer structure, resist composition, and use of the resist composition to produce submicron patterned resist structures are intended to be within the scope of the present invention, as indicated by the claims which follow.

What is claimed is:

1. A method of creating a lithographic resist structure comprising the steps of:
   1. applying a layer of resist comprising a polymeric material to a substrate, wherein said substrate is comprised of a second resist material;
   2. exposing said resist to radiation capable of creating a latent image within said resist; and,
   3. developing said radiation-exposed resist to provide a resist structure;

wherein the improvement comprises:
   said polymeric material having acid labile or photolabile groups pendant to the polymer backbone, and wherein after removal of said acid labile or photolabile groups, the resultant polymeric structure is thermally stable to temperatures greater than about 160° C. and contains a hydrogen bond donor and a free hydrogen bond acceptor, such that a hydrogen bonded network is generated upon said removal of said acid labile or said photolabile group and where in said hydrogen bonded network requires energy to break.

2. The method of claim 1 wherein said second resist material is sensitive to a different wavelength of radiation than said resist layer which overlays said second resist material.

3. A method of creating a lithographic resist structure comprising of the steps of:
1. applying a layer of resist sensitive to deep UV, electron beam, or X-ray radiation comprising a polymeric material to a substrate;
2. exposing said resist to deep UV, electron beam or X-ray radiation capable of creating a latent image within said resist; and
3. developing said radiation-exposed resist to provide a resist structure; wherein the improvement comprises: said polymeric material being selected from the group consisting of maleimide polymers, 1,2,4-triazoline-3,5-dione condensation polymers and styrene addition copolymers, said polymeric material having acid labile or photolabile groups pendant to the polymer backbone, and wherein after removal of said acid labile or photolabile groups, the resultant polymeric structure is thermally stable to temperatures greater than about 160° C. and contains a hydrogen bond donor and a free hydrogen bond acceptor, such that a hydrogen bonded network is generated upon said removal of said acid labile or said photolabile group and wherein said hydrogen bonded network requires energy to break.

4. The method of claim 3 wherein said substrate is comprised of a second resist material.

5. A method of creating a lithographic resist structure comprising the steps of:
1. applying a layer of resist to a substrate comprising a second resist material;
2. exposing said resist to radiation capable of creating a latent image within said resist, wherein said radiation does not significantly affect said underlaying second resist material;
3. developing said radiation-exposed resist to provide a patterned resist structure;
4. blanket exposing said patterned resist structure with radiation capable of creating a second latent image within said underlaying second resist material; and
5. developing said second latent image to create a composite resist structure of at least two layers;
wherein the improvement comprises:
said second resist material having acid labile or photo labile groups pendant to the polymer backbone, and wherein after removal of said acid labile or photo labile groups, the resultant underlaying second resist material is thermally stable to temperatures greater than about 160° C.

6. The method of claim 5 wherein removal of said acid labile or said photolabile groups results in presence of a hydrogen bond donor and a free hydrogen bond acceptor, such that a hydrogen bonded network is generated upon said removal of said acid labile or said photolabile group, and wherein said hydrogen bonded network requires energy to break.

7. The method of claim 5 wherein said second resist material is sufficiently transparent to deep UV radiation to permit deep UV imaging of said second resist material and wherein said imaged and developed second resist material is wet strippable after heat treatment to temperatures as high as 250° C.

8. The method of claim 7 wherein said second resist material contains functionalities capable of hydrogen bonding and is selected from the group consisting of polyvinyl benzoates, maleimide polymers, 1,2,4-triazoline-3,5-dione condensation polymers, and styrene addition copolymers.

9. The method of claim 1 or claim 4, wherein said polymeric material is sufficiently transparent to deep UV radiation to permit deep UV imaging of said polymeric material and wherein said imaged and developed polymeric material is wet strippable after heat treatment to temperatures as high as 250° C.

10. The method of claim 9 wherein oxygen, sulfur or nitrogen moieties within said polymeric material structure are substituted with an acid labile functional group or a photo labile functional group.

11. The method of claim 8 wherein oxygen or nitrogen moieties within said second resist material structure are substituted with an acid labile functional group or a photolabile functional group.

12. The method of claim 1 or claim 4 or claim 2 wherein said polymeric material is comprised of a substituted polyvinylbenzoate.

13. The method of claim 4 wherein said second resist material is sensitive to a different wavelength of radiation than said resist layer which overlays said second resist material.

14. The method of claim 8 wherein the second resist material is a styrene-maleimide copolymer or a styrene-acrylate copolymer.

15. The method of claim 3 wherein the polymeric material is a styrene-maleimide copolymer or a styrene-acrylate copolymer.

* * * * *

UNITED STATES PATENT AND TRADEMARK OFFICE
CERTIFICATE OF CORRECTION

PATENT NO. : 4,939,070

DATED : July 3, 1990

INVENTOR(S) : WILLIAM R. BRUNSVOLD et al.

It is certified that error appears in the above-identified patent and that said Letters Patent is hereby corrected as shown below:

On the cover page, left column  after item [76], please insert--

Assignee:   International Business Machines Corporation
                      Armonk, New York

Signed and Sealed this
Fifth Day of November, 1991

*Attest:*

HARRY F. MANBECK, JR.

*Attesting Officer*  *Commissioner of Patents and Trademarks*